US006828601B2

(12) United States Patent
Shinohara

(10) Patent No.: US 6,828,601 B2
(45) Date of Patent: Dec. 7, 2004

(54) CHARGE TRANSFER APPARATUS

(75) Inventor: Mahito Shinohara, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/875,010

(22) Filed: Jun. 7, 2001

(65) Prior Publication Data

US 2002/0017661 A1 Feb. 14, 2002

(30) Foreign Application Priority Data

Jun. 8, 2000  (JP) ........................................ 2000-172215
May 16, 2001 (JP) ........................................ 2001-146482

(51) Int. Cl.$^7$ ......................................... H01L 31/0328
(52) U.S. Cl. .................... 257/183.1; 257/215; 257/222; 257/225; 257/292
(58) Field of Search .............................. 257/238, 912, 257/183.1, 215, 222, 225, 227, 236, 292, 231

(56) References Cited

U.S. PATENT DOCUMENTS

| 4,139,784 A | * | 2/1979 | Sauer ........................... 377/57 |
| 4,765,149 A |   | 8/1988 | Shiga et al. ................... 62/174 |
| 4,912,560 A | * | 3/1990 | Osawa et al. ................ 257/223 |
| 4,962,412 A |   | 10/1990 | Shinohara et al. ............. 357/30 |
| 5,008,206 A |   | 4/1991 | Shinohara et al. .............. 437/3 |
| 5,053,872 A | * | 10/1991 | Matsunaga ................... 257/225 |
| 5,146,339 A |   | 9/1992 | Shinohara et al. ........... 358/212 |
| 5,280,358 A |   | 1/1994 | Yushiya et al. ......... 358/213.17 |
| 5,502,318 A | * | 3/1996 | Hynecek ..................... 257/217 |

FOREIGN PATENT DOCUMENTS

| JP | 54150946 A | * | 11/1979 | ............ H03H/7/28 |
| JP | 63-3886 |   | 2/1988 | |
| JP | 2-63314 |   | 3/1990 | |

OTHER PUBLICATIONS

Yusa, Atsushi, et al., SIT Image Sensor: Design Considerations and Characteristics, IEEE Transactions on Electron Devices, vol. ED–33, No. 6, Jun. 1986. IEEE Log No. 8608259.

Tanaka, Nobuyoshi, A 310 Pixel Bipolar Imager (BASIS), IEEE Transactions on Electron Devices, vol. 37, No. 4, Apr. 1990. IEEE Log No. 8933925.

Mendis, Sunetra K., et al., A 128×128 CMOS Active Pixel Image Sensor for Highly Integrated Imaging Systems, Center for Space Microelectronics Technology, Jet Propulsion Laboratory, California Institute of Technology, 48000 Oak Drive, Pasadena, CA, 91109. International Electron Devices Meeting, Wash., D.C., Dec. 5–8, 1993.

* cited by examiner

Primary Examiner—Paul E Brock, II
(74) Attorney, Agent, or Firm—Fitzpatrick, Cella, Harper & Scinto

(57) ABSTRACT

To transfer signal charges at high speed with small noise, there is provided a charge transfer apparatus including a semiconductor substrate of one conductivity type, a charge transfer region of a conductivity type opposite to that of the semiconductor substrate that is formed in the semiconductor substrate and joined to the semiconductor substrate to form a diode, a signal charge input portion which inputs a signal charge to the charge transfer region, a signal charge output portion which accumulates the signal charge transferred from the charge transfer region, and a plurality of independent potential supply terminals which supply a potential gradient to the semiconductor substrate, wherein the signal charge in the charge transfer region is transferred by the potential gradient formed by the plurality of potential supply terminals.

3 Claims, 11 Drawing Sheets

CHARGE TRANSFER APPARATUS

BACKGROUND OF THE INVENTION

1. Field of the Invention

The present invention relates to a charge transfer apparatus for transferring charges, and an image pickup apparatus using the same.

2. Related Background Art

Conventional charge transfer elements are a CCD (Charge Coupled Device) and CSD (Charge Sweep Device; Japanese Patent Publication No. 63-38866 and Japanese Laid-Open Patent Application No. 2-63314), and are mainly applied to solid-state image pickup elements. These charge transfer elements consist of MOS diodes formed on a semiconductor, and receive signal charges in depletion layers formed near the semiconductor interface by controlling the gate electrode potentials of the MOSs. The CCD and CSD adopt different transfer methods. The CCD is constituted by forming multistage MOS diodes, a potential well is formed on each stage, and a plurality of independent signal charges are assigned to a plurality of potential wells. The gate electrode potential of MOS on the respective stage is sequentially changed to sequentially move the position of the potential well, and the signal charges are simultaneously transferred accordingly. The CSD is multistage MOS diodes or a single MOS diode. One CSD transfer path, which forms one potential well, receives only one signal charge, and thus the maximum transferable charge is large. Charges are transferred by sequentially changing the gate electrode potentials of MOSs and sequentially moving the potential barrier position in the potential well.

Noise generating during transfer in the charge transfer element is mainly a dark current generating from a semiconductor substrate or MOS interface. Both the CCD and CSD can transfer signal charges with small noise.

However, the CCD or CSD used in a solid-state image pickup element suffers the following problem.

As for an interline CCD which is most widely used among CCD solid-state image pickup elements, optical signal detection photodiodes are two-dimensionally arrayed, and signal charge transfer CCDs (vertical CCDs) are interposed between the photodiode columns. If the photodiode area is increased to increase the sensitivity in this arrangement, the CCD area must be decreased. All of the signal charges of photodiodes on one column are transferred at once to a plurality of potential wells in the vertical CCD and then transferred. The maximum charge amount per photodiode that can be transferred by the CCD is proportional to the area of one stage of MOS diodes which form one potential well. Thus, if the CCD area is decreased, the acceptable maximum charge amount is restricted. The processible maximum signal charge amount per photodiode determines the dynamic range of an image pickup apparatus. As for an interline CCD, a high-sensitivity design and a wide-dynamic-range design are contradictory to each other.

In the arrangement of a CSD solid-state image pickup element, similar to the interline CCD, CSD charge transfer paths are interposed between photodiode columns. In this case, the entire CSD region of one column receives the signal charge of one photodiode. Even if, therefore, the CSD transfer path is narrowed, the acceptable maximum charge amount is not actually restricted, and the processible maximum charge amount is determined by the maximum accumulation charge amount of one photodiode. The CSD solid-state image pickup element can simultaneously realize high sensitivity and wide dynamic range by increasing the photodiode area. However, the CSD can transfer only a set of signal charges at once, its operation is inevitably line-sequential driving, and the signal charges of photodiodes on a row selected for signal transfer must be transferred at high speed. Particularly in a movie image pickup apparatus, the signal read-out time of one row is determined by a standard, and the signal charges of a photodiode must be transferred to the output terminal of the CSD transfer path within this time.

A CSD charge transfer method for solving this problem will be explained with reference to FIGS. 1A to 1E. FIG. 1A is a schematic sectional view of a CSD, and FIGS. 1B to 1E are views of the potentials for explaining the transfer method. In FIG. 1A, a semiconductor substrate 1 is a p-type substrate. The semiconductor substrate 1, an insulating layer 2, and a gate electrode 3 made of polysilicon or the like form a MOS diode. Terminals $\phi 1$, $\phi 2$, $\phi 3$, $\phi 4$, and $\phi 5$ for supplying potentials to the electrode 3 supply potentials at positions apart from each other at a certain interval. A gate electrode 4 is made of polysilicon or the like. The semiconductor substrate 1, insulating layer 2, and gate electrode 4 form a MOS diode. A terminal $\phi s$ supplies a potential to the electrode 4.

FIGS. 1B to 1E show the potentials of the charge transfer path, i.e., near the semiconductor interface below the MOS diode, and show transfer of a signal charge Qsig. In this case, the signal charge carriers to be transferred are electrons. In FIG. 1B, the terminals $\phi 2$, $\phi 3$, $\phi 4$, and $\phi 5$ are at potentials high enough to deplete the interface of the semiconductor substrate 1 below the electrode 3. At this time, the terminal $\phi 1$ is set at a lower potential than the terminal $\phi 2$. A potential gradient is generated between the terminals $\phi 1$ and $\phi 2$ of the electrode 3, and thus a potential gradient is generated in the transfer path below them. In this case, the electrons drift in the X direction in FIG. 1A. As the location where the electrode 3 gives a potential gradient sequentially shifts, as shown in FIGS. 1C to 1E, the signal charge drifts. The terminal $\phi s$ applies a higher potential than that of the terminal $\phi 5$ to the electrode 4 in contact with the end of the electrode 3. A deep potential well is formed at the semiconductor interface below the electrode 4, and signal charges are finally collected to this well.

The CSD using this potential gradient can ensure a higher motion speed of signal charges than the CCD transferring charges mainly by charge diffusion. However, the CSD is difficult to realize high-speed charge transfer required for an image pickup apparatus such as a movie camera owing to the following problems.

(1) Since the capacitance between the MOS electrode and the semiconductor interface and that between the semiconductor interface and the semiconductor bulk are connected in series, only a value obtained by multiplying the potential gradient supplied to the MOS electrode by the capacitance division ratio is applied to the semiconductor interface. This capacitance division ratio is generally as low as about 0.1 to 0.3.

(2) Since the potential gradient supplied to the MOS electrode introduces an ohmic current through this portion, a large potential gradient is difficult to apply.

(3) The charge mobility at the semiconductor interface serving as a transfer path is lower than that in the semiconductor bulk.

The CSD is widely used in an infrared image pickup apparatus which must process a large amount of signal charges, but is difficult due to those problems to use in an image pickup apparatus for a visible region with a high signal read-out speed.

SUMMARY OF THE INVENTION

It is an object of the present invention to provide a charge transfer apparatus capable of high-speed signal read-out and an image pickup apparatus using the same.

It is another object of the present invention to provide an image pickup apparatus capable of high-speed signal read-out with high sensitivity and wide dynamic range.

To achieve the above object, according to an aspect of the present invention, there is provided a charge transfer apparatus comprising a semiconductor substrate of one conductivity type, a charge transfer region of a conductivity type opposite to the conductivity type of the semiconductor substrate that is formed in the semiconductor substrate and joined to the semiconductor substrate to form a diode, a signal charge input portion adapted to input a signal charge to the charge transfer region, a signal charge output portion adapted to accumulate the signal charge transferred from the charge transfer region, and a plurality of independent potential supply portions adapted to supply a potential gradient to the semiconductor substrate, wherein the signal charge in the charge transfer region is transferred by the potential gradient formed by the plurality of potential supply portions.

According to another aspect of the present invention, there is provided a charge transfer apparatus comprising a semiconductor substrate of one conductivity type, a well of a conductivity type opposite to the conductivity type of the semiconductor substrate that is formed in the semiconductor substrate, a charge transfer region of a conductivity type opposite to the conductivity type of the well that is formed in the well and joined to the well to form a diode, a signal charge input portion adapted to input a signal charge to the charge transfer region, a signal charge output portion adapted to accumulate the signal charge transferred from the charge transfer region, and a plurality of independent potential supply portions adapted to supply a potential gradient to the well, wherein the signal charge in the charge transfer region is transferred by the potential gradient formed by the plurality of potential supply portions.

According to still another aspect of the present invention, there is provided an image pickup apparatus comprising a semiconductor region of one conductivity type, photoelectric conversion portions two-dimensionally arrayed in the semiconductor region, charge transfer regions of a conductivity type opposite to the conductivity type of the semiconductor region that are interposed between respective columns of the photoelectric conversion portions and form junctions together with the semiconductor region, transfer electrodes adapted to transfer and input signal charges to the charge transfer regions, signal charge output portions adapted to accumulate the signal charges transferred from the charge transfer regions, and a plurality of independent potential supply portions adapted to supply a potential gradient to the semiconductor region, wherein the signal charges input to the charge transfer regions are transferred in a column direction by the potential gradient formed by the plurality of potential supply portions.

According to still another aspect of the present invention, there is provided an image pickup apparatus comprising a semiconductor region of one conductivity type, photoelectric conversion portions two-dimensionally arrayed in the semiconductor region, charge transfer regions of a conductivity type opposite to the conductivity type of the semiconductor region that are interposed between respective columns of the photoelectric conversion portions and form junctions together with the semiconductor region, signal amplifier portions adapted to amplify signal charges transferred from the charge transfer regions, and a plurality of independent potential supply portions adapted to supply a potential gradient to the semiconductor region, wherein the signal charges accumulated in the photoelectric conversion portions by the potential gradient formed by the plurality of potential supply portions are input to the signal amplifier portions via the transfer regions, and signals amplified by the amplifier portions are output.

The above and other objects, and features of the present invention will be apparent from the following description in conjunction with the accompanying drawings.

DETAILED DESCRIPTION OF THE PREFERRED EMBODIMENTS

Preferred embodiments of the present invention will be described in detail below with reference to the accompanying drawings.

Figure 2A:
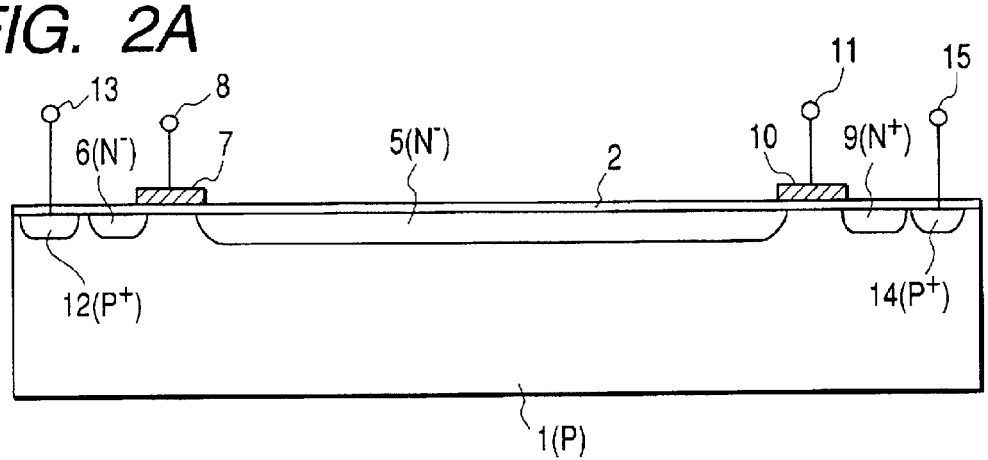
FIGS. 2A, 2B, 2C, 2D and 2E are views for explaining a charge transfer element according to the first embodiment of the present invention.

FIG. 2A is a sectional view of a charge transfer element according to the first embodiment of the present invention, and FIGS. 2B to 2E are views of the potentials showing the transfer method.

Figure 1A:
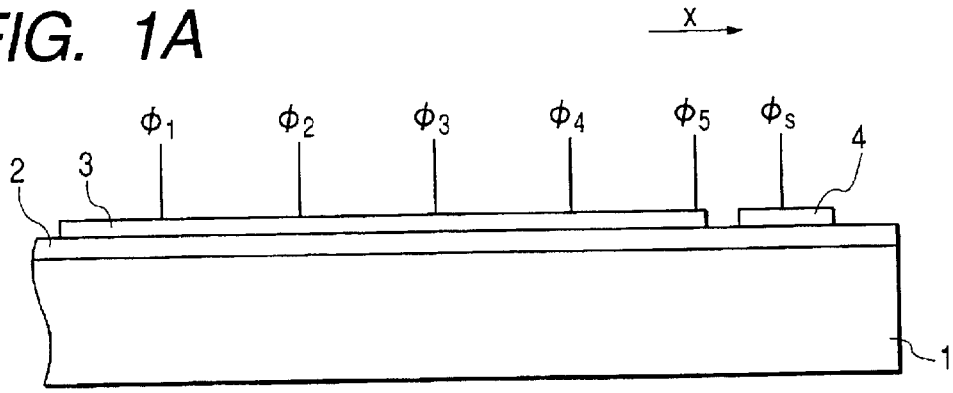
FIGS. 1A, 1B, 1C, 1D and 1E are views for explaining the operation of a conventional charge transfer element.
Figure 1B:
Figure 1C:
Figure 1D:
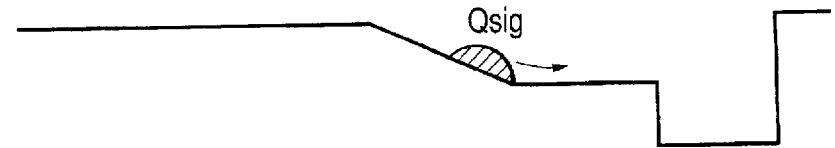
Figure 1E:

In FIG. 2A, an insulating layer 2 is formed at the semiconductor interface on a p-type semiconductor substrate 1. The same reference numerals as in FIG. 1A denote the same parts. A lightly doped n-type semiconductor region 5 serves as a charge transfer region, and an n-type semiconductor region 6 serves as a signal charge input portion. A gate electrode 7 transfers and inputs signal charge carriers (in this case, electrons) in the n-type semiconductor region 6 to the n-type semiconductor region 5 serving as the charge transfer region. A terminal 8 applies a potential to the gate electrode 7. An n-type semiconductor region 9 serves as the signal charge output portion for transferred signal charges. A gate electrode 10 transfers and outputs the electrons in the n-type semiconductor region 5 serving as the charge transfer region to the n-type semiconductor region 9 serving as the signal charge output portion. A terminal 11 applies a potential to the gate electrode 10. A p-type semiconductor region 12 is located near the n-type semiconductor region 6 serving as the signal charge input portion, and applies a potential to the semiconductor substrate at this position. A terminal 13 applies a potential to the p-type semiconductor region 12. A p-type semiconductor region 14 is located near the n-type semiconductor region 9 serving as the signal charge output portion, and applies a potential to the semiconductor substrate at this position. A terminal 15 applies a potential to the p-type semiconductor region 14.

FIGS. 2B to 2E are views of potentials at the signal charge input portion, charge transfer region, and signal charge output portion in signal charge transfer operation, and show transfer of a signal charge Qsig. Signal charge carriers to be transferred are electrons, and the electron potential is higher for a lower potential. Signal charge transfer operation of the first embodiment will be described with reference to the potential views. In the following description, the n-type semiconductor region 6 will be referred to as a signal charge input portion; the n-type semiconductor region 5, a charge transfer region; and the n-type semiconductor region 9, a signal charge output portion.

Figure 2B:

FIG. 2B shows a state before transfer in which signal charge carriers (in this case, electrons) as charges to be transferred are at the signal charge input portion 6. The terminals 13 and 15 may receive the same potential or different potentials. When different potentials are applied, the potential of the terminal 13 is lower than that of the terminal 15. The terminal 8 receives a low potential so as to electrically isolate the signal charge input portion 6 from the charge transfer region 5. The terminal 11 receives a high potential so as to electrically connect the signal charge output portion 9 and charge transfer region 5. The potential of the signal charge output portion 9 is set much higher than that of the terminal 15. All electrons as signal charges in the charge transfer region 5 diffuse or drift to the signal charge output portion 9, thereby completely depleting the charge transfer region 5.

Figure 2C:
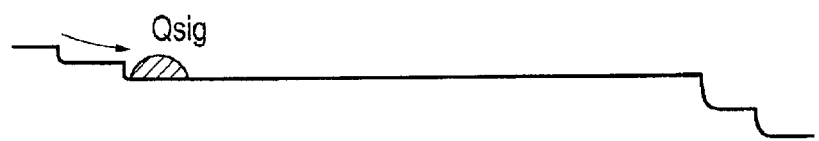

FIG. 2C shows a state in which the signal charge Qsig is input and transferred from the signal charge input portion 6 to the charge transfer region 5. At this time, the terminal 8 receives a high potential so as to electrically connect the signal charge input portion 6 and charge transfer region 5, and the signal charge is input. Note that the signal charge input portion 6 is a lightly doped semiconductor region, and is completely depleted after signal charge carriers (in this case, electrons) are transferred and input. The potentials of the terminals 11, 13, and 15 are the same as those in the state of FIG. 2B.

Figure 2D:
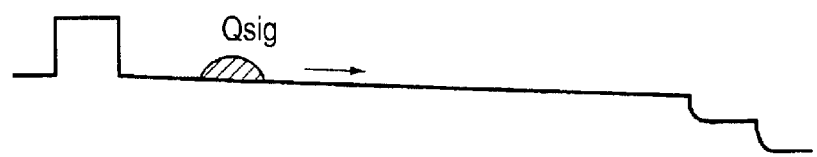

FIG. 2D shows a state in which the signal charge Qsig is transferred and moved from the signal charge input portion 6 toward the signal charge output portion 9 via the charge transfer region 5. At this time, the terminal 8 is set to a low potential so as to turn off the gate electrode 7 for inputting signal charges, and the terminal 13 is set to a lower potential than the terminal 15. In this state, a potential gradient is generated in the semiconductor substrate 1 along from the terminal 13 to the terminal 15. This potential gradient appears in the completely depleted charge transfer region 5. The signal charge Qsig in the charge transfer region drifts due to the potential gradient, and finally reaches the signal charge output portion 9.

Figure 2E:

FIG. 2E shows a state in which the signal charge transferred to the signal charge output portion 9 is accumulated. The signal charge Qsig is accumulated in the signal charge output portion 9 via a path below the gate electrode 10. Then, the potential of the terminal 11 drops, and the signal charge output portion 9 and charge transfer region 5 are electrically isolated, thereby completing signal charge transfer.

In the above-described embodiment, as long as the signal charge output portion is a means capable of sweeping all the signal charges in the charge transfer region to the signal charge output portion before transfer operation and accumulating the signal charges transferred by transfer operation, the signal charge output portion may be a floating diffusion structure for detecting a potential change (voltage (signal)) caused by the transferred signal charges.

Figure 3:
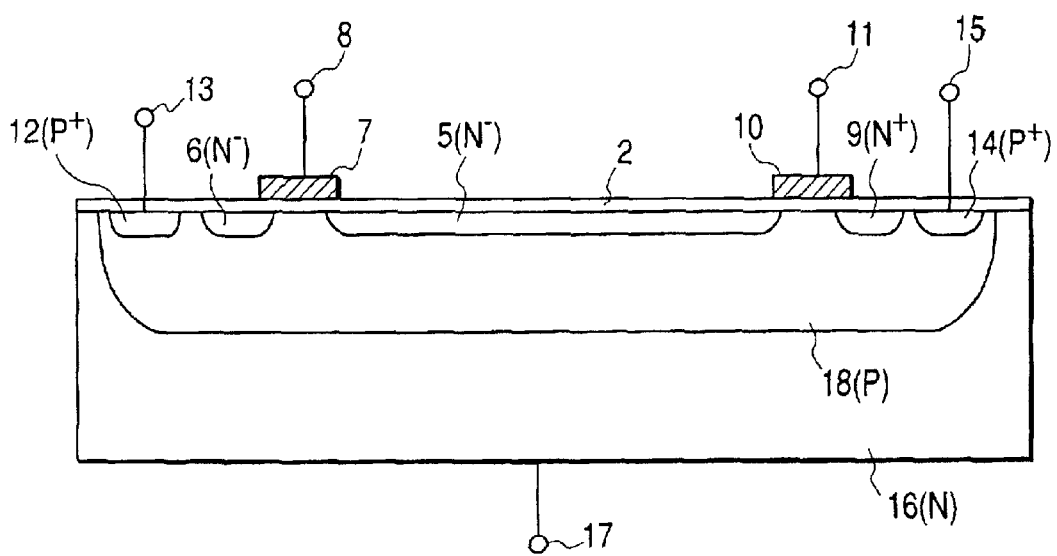
FIG. 3 is a sectional view for explaining a charge transfer element according to the second embodiment of the present invention.

FIG. 3 is a sectional view of a charge transfer element according to the second embodiment of the present invention. In FIG. 3, a terminal 17 applies a potential to an n-type semiconductor substrate 16. A p-type well 18 is formed in the semiconductor substrate 16. In FIG. 3, the same reference numerals as in FIG. 2A denote the same parts, and a description thereof will be omitted. In the second embodiment, the potential of the terminal 17 is set higher than those of terminals 13 and 15 so as to inversely bias the p-type well 18 and n-type substrate 16. The arrangement and operation of the charge transfer apparatus formed in the p-type well 18 are the same as those in the first embodiment.

In the second embodiment, the n-type substrate and p-type well are electrically isolated, so that another electrical element can be independently formed at a location other than the p-type well where the charge transfer apparatus is formed.

Figure 4A:
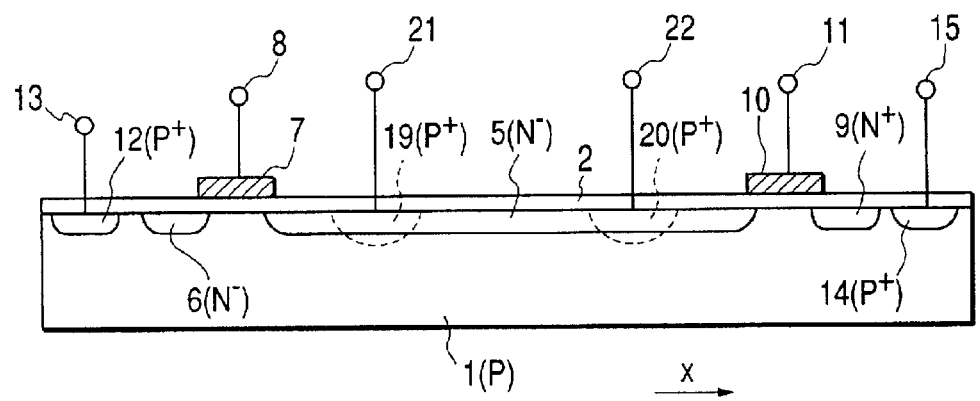
FIGS. 4A, 4B, 4C and 4D are views for explaining a charge transfer element according to the third embodiment of the present invention.

FIG. 4A is a sectional view of a charge transfer element according to the third embodiment of the present invention, and FIGS. 4B to 4E are views of the potentials showing the transfer method.

In FIG. 4A, p-type semiconductor regions 19 and 20 are formed near a charge transfer region 5 to ohmic-contact a p-type substrate 1, and are aligned in the charge transfer direction (X direction in FIG. 4A). The semiconductor regions 19 and 20 overlap the charge transfer region 5 in FIG. 4A, but are indicated by dotted lines to represent that they are located slightly apart from the charge transfer region 5 in a direction perpendicular to the sheet surface of FIGS. 4A to 4D. Terminals 21 and 22 apply potentials to the semiconductor regions 19 and 20. In FIG. 4A, the same reference numerals as in FIGS. 2A to 2E denote the same parts, and a description thereof will be omitted.

Signal charge input operation and the operation of the output portion in the third embodiment are the same as those in the first embodiment, and a description thereof will be omitted. Charge transfer operation will be explained with reference to FIGS. 4B to 4D showing the potentials at this operation.

Figure 4B:
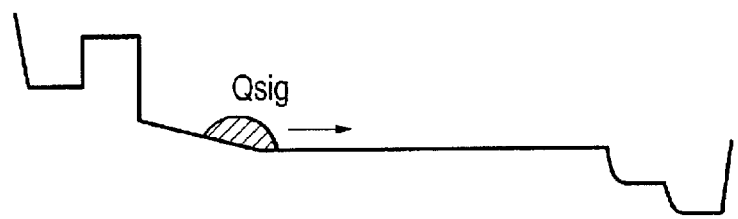
Figure 4C:
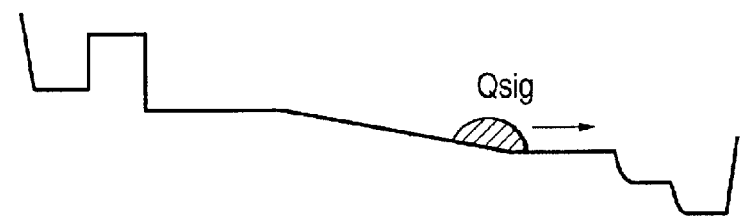
Figure 4D:
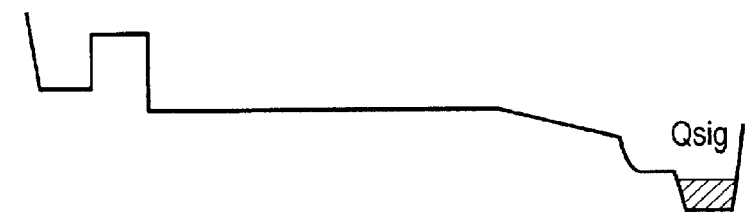

FIG. 4B is a view of the potential after signal charges are input, and shows a state in which the terminals 21 and 22 and a terminal 15 receive the same potential, a terminal 13 receives a lower potential, and signal charges are transferred by a potential gradient extending from a semiconductor region 12 to the semiconductor region 19. The position of the potential gradient sequentially changes as follows. The potentials of the terminals 13, 15, 21, and 22 are changed to generate a potential gradient between the semiconductor regions 19 and 20 in FIG. 4C and a potential gradient between the region 20 and a region 14 in FIG. 4D. By supplying the potential gradient to the location where signal charges exist in this manner, the charges can be transferred by a larger potential gradient than that in the first embodiment so long as the supplied potential difference is the same. As a result, higher-speed signal charge transfer can be realized. Note that the third embodiment can also be implemented by a p-type well in an n-type semiconductor substrate, like the second embodiment.

In the first, second, and third embodiments described above, the charge transfer path (charge transfer region) is an n-type semiconductor region in contact with the semiconductor interface. Alternatively, a region near the semiconductor interface may be formed from a semiconductor layer of the same p type as the substrate or well, and the n-type semiconductor region serving as a charge transfer path may be buried in the semiconductor substrate. In this buried structure, the signal charge mobility is higher than that in a case wherein the charge transfer path is in contact with the semiconductor interface. Thus, charges can be transferred at higher speed, dark current generated from the charge transfer path during charge transfer can be reduced, and signal charges almost free from noise can be obtained.

In all the above embodiments, the charge transfer path is an n-type semiconductor region, and the signal charge carriers to be transferred are electrons. Alternatively, the p and n types of the semiconductor may be reversed, the polarity of an applied potential may also be reversed, and the signal charge carriers to be transferred may be holes.

In the charge transfer elements of the first to third embodiments, the impurity concentration of the charge transfer region is desirably controlled in advance so as to completely deplete the charge transfer region by setting the potential of the signal charge output portion and that of the semiconductor substrate or well to appropriate values.

Signal charges input from the signal charge input portion while the charge transfer region is completely depleted drift by a potential gradient in the charge transfer region that is generated by supplying a potential gradient to the semiconductor substrate or well.

Similar to a CSD, the charge transfer element is a p-n junction diode in which only a set of signal charges can be transferred by one transfer operation, and the charge transfer region is not the semiconductor interface of a MOS diode but the region on the charge transfer path side is completely depleted. For this reason, the potential gradient supplied to the semiconductor substrate or well directly acts as the potential gradient in the charge transfer path. Since the resistance of the semiconductor can be set higher than that of general polysilicon as the gate electrode of the MOS, a larger potential gradient can be easily generated. If a region serving as a charge transfer path is formed in the semiconductor substrate or well by adopting a buried diode structure, the mobility of signal charges to be transferred becomes higher than that at the semiconductor interface.

With these technological effects, high-speed line-sequential signal charge transfer can be implemented by using the above-described charge transfer element as the charge transfer portion of a solid-state image pickup element. This charge transfer element can cope with moving pictures of visible light. Unlike an interline CCD solid-state image pickup element, narrowing the transfer path does not actually restrict the processible maximum charge amount. By increasing the photodiode area, a high-sensitivity, wide-dynamic-range solid-state image pickup element can be provided.

Figure 5:
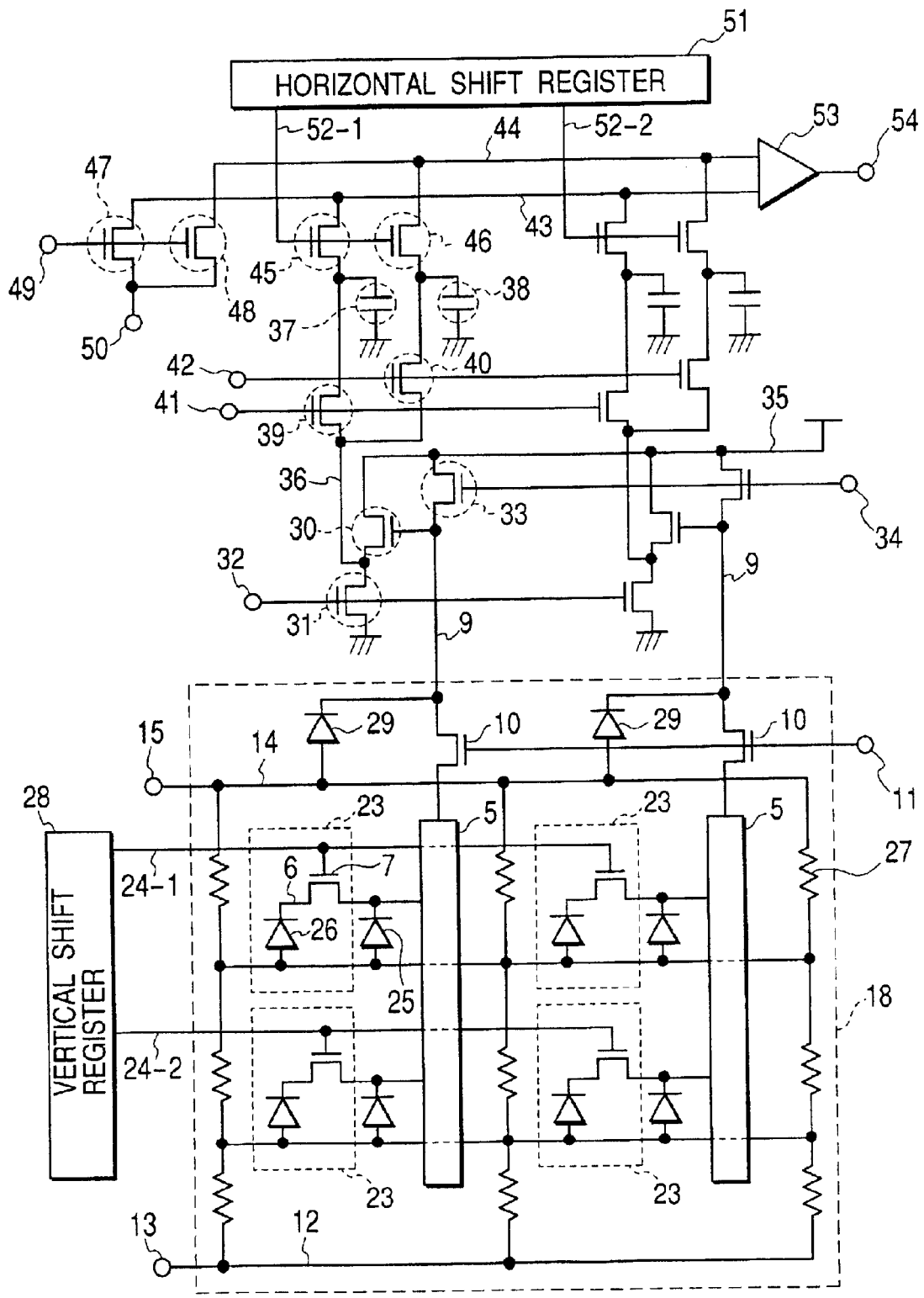
FIG. 5 is a circuit diagram for explaining a solid-state image pickup element according to the fourth embodiment of the present invention.
Figure 6:
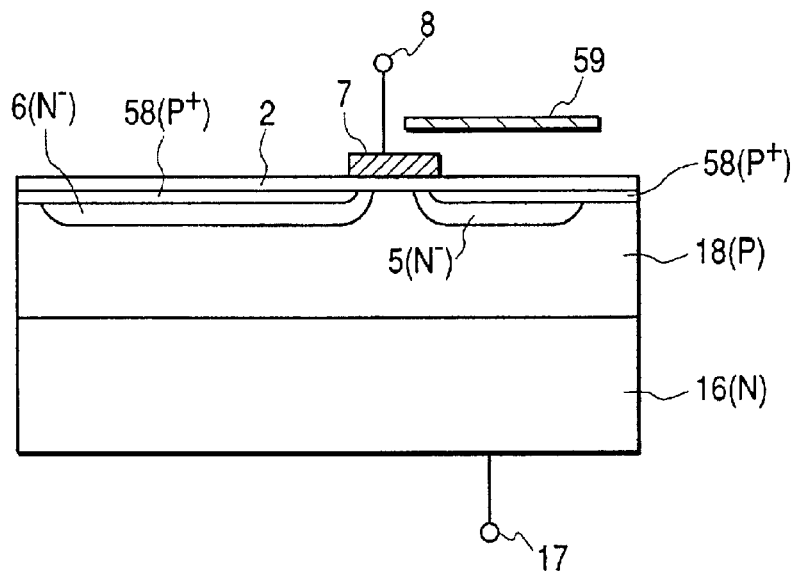
FIG. 6 is a sectional view for explaining the solid-state image pickup element according to the fourth embodiment of the present invention.
Figure 7:
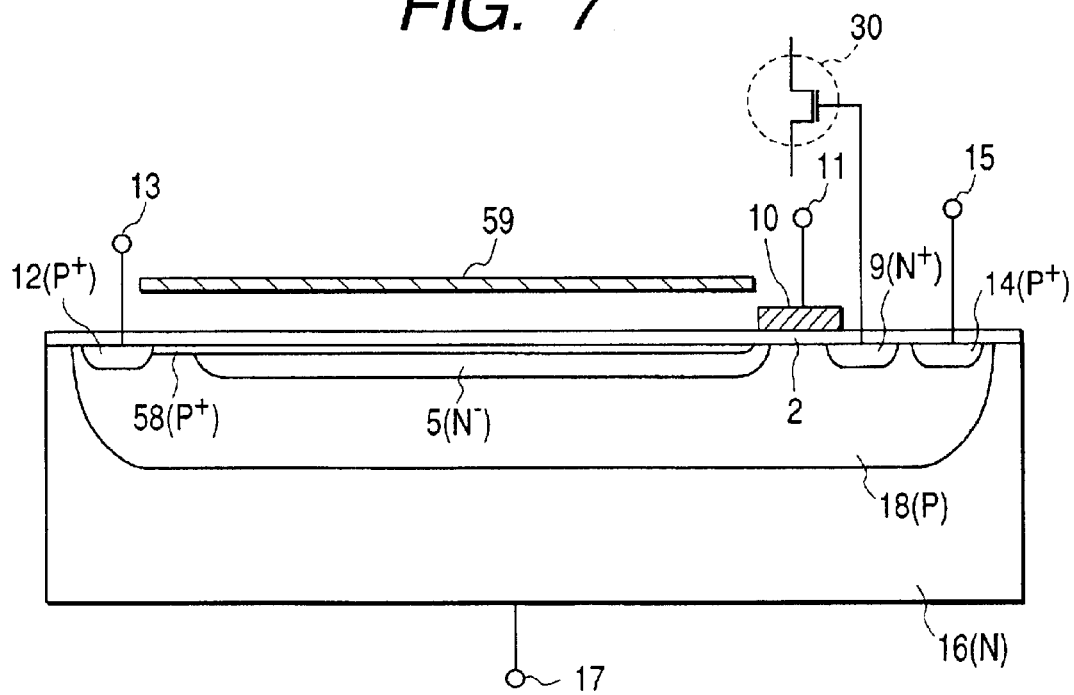
FIG. 7 is a sectional view for explaining the solid-state image pickup element according to the fourth embodiment of the present invention.

The fourth embodiment of the present invention relates to a solid-state image pickup element using the charge transfer element of the second embodiment described above. The circuit of the solid-state image pickup element is shown in FIG. 5, and its sectional structure is shown in FIGS. 6 and 7. In FIGS. 5, 6, and 7, the same reference numerals as in FIGS. 2A to 2E, 3, and 4A to 4D denote the same parts, and a detailed description thereof will be omitted.

In the solid-state image pickup element of FIG. 5, unit pixels are two-dimensionally arrayed, and charge transfer regions 5 are interposed between the pixel columns. These pixel regions are formed in a p-type well 18. FIG. 5 shows 2×2 pixels for descriptive convenience. The p-type well 18 receives potentials from regions 12 and 14 on the lower and upper sides in FIG. 5, and the potential of the p-type well 18 between the regions 12 and 14 is set via well resistors 27. Each photodiode 26 is formed from the p-type well 18 and a region 6 for accumulating signal charge carriers (in this case, electrons) generated by incident light. Each diode 25 is formed from a corresponding charge transfer region 5 and the p-type well 18. Each pixel 23 is made up of the region 6, a gate electrode 7 (part of the gate electrode 7 and regions 6 and 5 constitute a MOS switch), and the photodiode 26. A vertical shift register 28 selects arrayed pixels in units of rows, and its outputs 24-1 and 24-2 are connected to the transfer gate electrodes 7 on the pixels of the first and second rows.

Signal charges transferred from the region 6 to the region (charge transfer region) 5 by changing the gate electrode 7 to H level are transferred to a region 9. A gate electrode 10 constitutes a MOS switch together with the region 9 and part of the region 5. In this case, the region 9 is of the floating diffusion type. Each diode 29 is formed between a corresponding region 9 and the p-type well 18. The structures of the photoelectric conversion pixel region and the portion for outputting signal charges transferred from this region have been described.

The structure of a read-out circuit for reading out as an image pickup signal the signal charges of a pixel that are transferred and output to the signal charge output portion will be explained. Each MOS transistor 30 for a source follower amplifier has a gate connected to a corresponding region 9 serving as a charge output portion. Each MOS transistor 31 supplies a constant current. Each MOS transistor 33 resets the region 9. A power supply potential line 35 is connected to the drains of the MOS transistors 30 and 33. A terminal 32 supplies a potential to the gate of the MOS transistor 31, and the potential is so set as to operate the MOS transistor 31 as a constant current source. A terminal 34 supplies a pulse to the gate of the MOS transistor 33. An output signal line 36 is for a source follower formed from the MOS transistors 30 and 31. Each accumulation capacitor 37 accumulates the reset output voltage of the source follower. Each accumulation capacitor 38 accumulates the output voltage of the source follower to which a signal is added to the reset level. MOS transistors 39 and 40 switch the output signal line 36 and accumulation capacitor 37, and the output signal line 36 and accumulation capacitor 38, respectively. Terminals 41 and 42 supply pulses to the gates of the MOS transistors 39 and 40, respectively. Horizontal output lines 43 and 44 supply voltages accumulated in the accumulation capacitors 37 and 38, respectively. MOS transistors 45 and 46 control connection between the accumulation capacitor 37 and the horizontal output line 43, and connection between the accumulation capacitor 38 and the horizontal output line 44, respectively. MOS transistors 47 and 48 reset the horizontal output lines 43 and 44, respectively. A terminal 49 supplies pulses to the gates of the MOS transistors 47 and 48. A terminal 50 supplies the reset potentials of the horizontal output lines 43 and 44. A horizontal shift register 51 sequentially selects and scans the accumulation capacitances on respective columns. Outputs 52-1 and 52-2 of the horizontal shift register 51 are respectively connected to the gates of the MOS transistors 45 and 46 on the first column and those on the second column. A differential amplifier 53 operates to output the differential voltage between the potentials of the horizontal output lines 43 and 44. The differential amplifier 53 has an output terminal 54.

All the MOS transistors in FIG. 5 are of n type. Each MOS transistor is ON when its gate is at high level and OFF when its gate is at low level. The MOS transistors in the read-out circuit are formed in a p-type well electrically independent of the p-type well 18.

FIG. 6 shows the lateral sections of the pixel and charge transfer region in the fourth embodiment. In FIG. 6, a p-type semiconductor layer 58 is formed at the interface of the p-type well region 18, electrically connected to the p-type well region 18, and constituted to bury both the charge transfer region 5 and the region 6 for accumulating optical signal charges in the semiconductor. A light-shielding layer 59 shields light incident on the signal charge transfer region 5. Signal charges are transferred in a direction perpendicular to the sheet surface of FIG. 5.

FIG. 7 shows the section of the charge transfer region in the longitudinal direction, i.e., transfer direction in the fourth embodiment. The same reference numerals as those described above denote the same parts, and a description thereof will be omitted.

Figure 8:
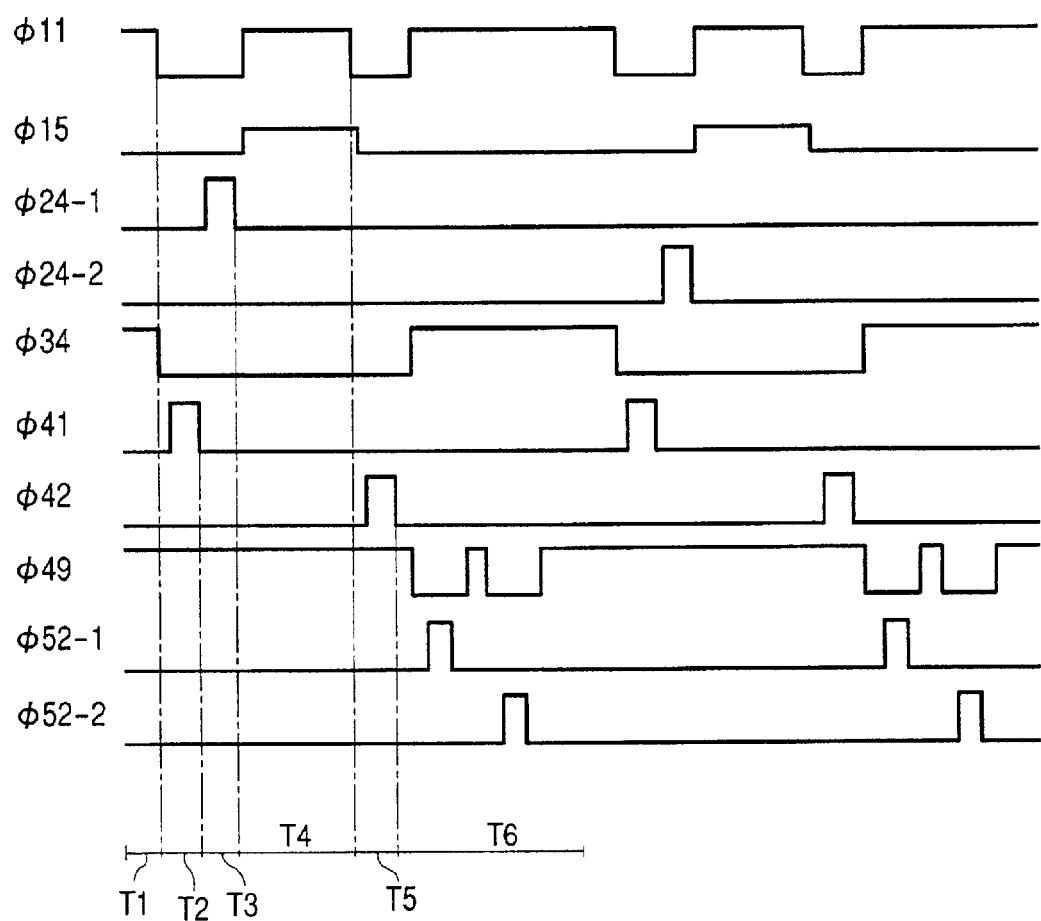
FIG. 8 is a timing chart for explaining the operation of the solid-state image pickup element according to the fourth embodiment of the present invention.

The operation of the solid-state image pickup element in FIG. 5 will be explained with reference to FIG. 8. FIG. 8 is a pulse timing chart. Numbers suffixed to φ denote the numbers of the terminals in FIG. 5. Periods T1 to T6 divided in accordance with operation timings represent specific operation periods. Note that the terminal 13 always receives a predetermined potential and is not illustrated in FIG. 8.

The period T1 in FIG. 8 is the reset period of the charge transfer region 5 and the region 9 serving as a charge output portion. The region 9 is connected via the MOS transistor 33 to a power supply line having a high potential. At this time, electrons as signal charge carriers in the charge transfer region 5 are swept to the region 9 via the channel below the gate electrode 10, and the region 5 is completely depleted.

The period T2 is a noise read-out period. During this period, the terminals 11 and 34 change to low level, and the region 9 floats. The region 9 holds a power supply line potential by reset operation in the period T1, and the reset output potential of the source follower made up of the MOS transistors 30 and 31 is accumulated in the accumulation capacitor 37 via the MOS transistor 39. The reset output potential of the source follower is different between columns owing to variations in the threshold voltage values of the MOS transistors 30 on the columns. Even for individual one source follower, a different reset output potential is generated every repetitive operation in the period T1 because of thermal noise, i.e., kTC noise which depends on the capacitance of the region 9.

The period T3 is a period when signal charges accumulated in the region 6 serving as a charge input portion in the pixel are transferred and input to the charge transfer region 5. This operation is done by supplying a pulse to the gate electrodes 7 on a row selected by the vertical shift register 28. The period T4 is a charge transfer period. The terminal 15 receives a potential higher than that of the terminal 13. Signal charge carriers (in this case, electrons) drift upward in FIG. 5, and are finally output to the region 9 via the channel below the gate 10.

The period T5 is a signal read-out period. The region 9 serving as a signal output portion additionally receives signal charges transferred in the reset period in the period T2. Thus, an output obtained by adding the signal to the noise level is output to the output signal line 36 of the source follower, and this voltage is accumulated in the accumulation capacitor 38 via the MOS transistor 40. The period T6 is a horizontal scan period. After the horizontal output lines 43 and 44 are reset via the reset MOS transistors 47 and 48, voltages accumulated in the accumulation capacitors 37 and 38 on columns selected by the horizontal shift register 51 are respectively supplied to the horizontal output lines 43 and 44, and input to the differential amplifier 53. The differential amplifier 53 outputs only a pure signal voltage from which the noise level is subtracted.

As the vertical shift register shifts one stage, a series of operations described above are repeated, and pixel signals on all the rows are finally read out to form an image pickup signal.

In the fourth embodiment, signal charges transferred by the source follower formed on each column are converted into a voltage signal. An amplifier other than the source follower may be used, or a scheme such as a clamp circuit may be used as a noise removal scheme. In other words, any read-out circuit system may be employed as far as transferred signal charges of a pixel are converted into an electrical signal and electrical signals are sequentially read out to form an image pickup signal.

The above-described fourth embodiment can provide a solid-stage image pickup element which can simultaneously realize a wide dynamic range and high sensitivity by designing a large photodiode area of a pixel, which is almost free from noise generated by a dark current because the transfer region is formed of a buried photodiode and buried diode in the fourth embodiment, and which also copes with moving pictures by high-speed charge transfer. The solid-state image pickup element of the fourth embodiment does not adopt any charge transfer element using a MOS diode, and the read-out circuit can be constituted by only MOS transistors. This solid-state image pickup element can be manufactured on the basis of not a CCD process but a simple CMOS process, resulting in low manufacturing cost.

Figure 9:
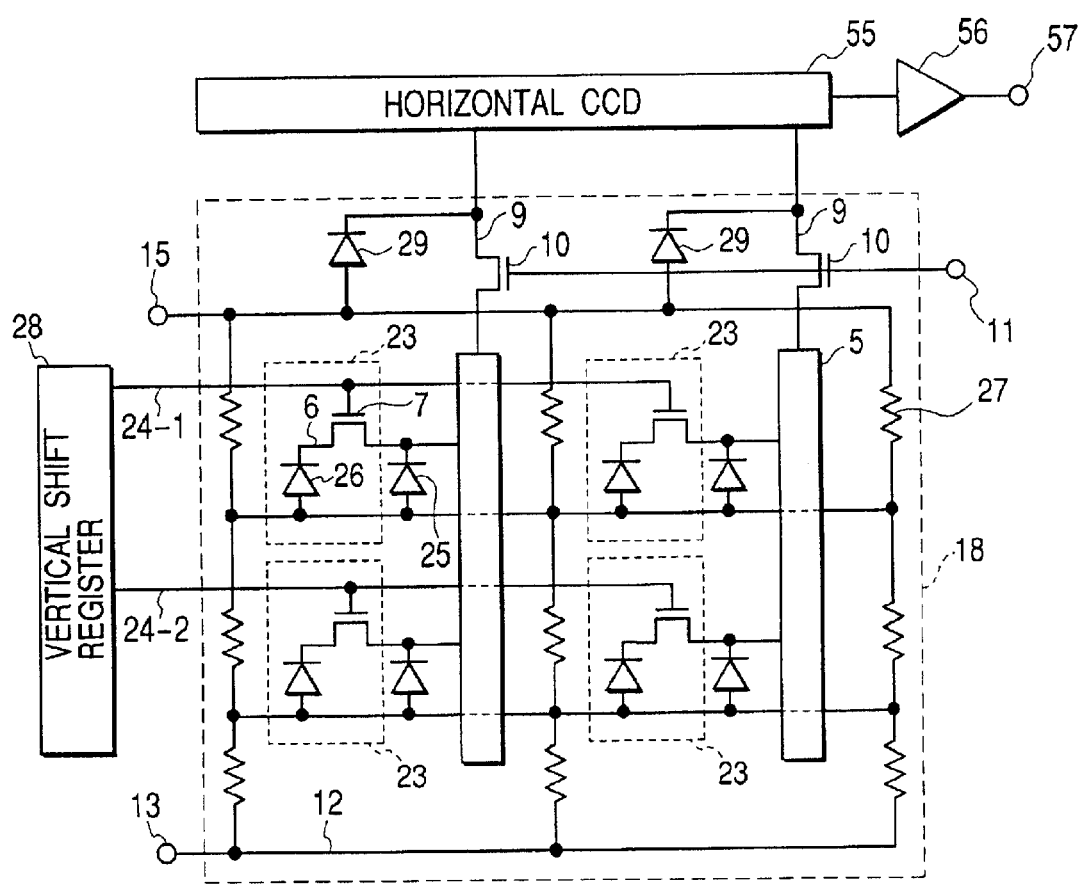
FIG. 9 is a circuit diagram for explaining a solid-state image pickup element according to the fifth embodiment of the present invention.

The fifth embodiment of the present invention concerns another example of a solid-state image pickup element using the charge transfer element of the second embodiment described above. This solid-state image pickup element is shown in FIG. 9. In FIG. 9, the same reference numerals as in FIGS. 2A to 2E, 3, 4A to 4D, and 5 denote the same parts, and a detailed description thereof will be omitted.

In FIG. 9, a horizontal CCD 55 horizontally transfers transferred signal charges. An amplifier 56 detects a signal charge amount output from the horizontal CCD 55 and outputs it as an electrical signal. The amplifier 56 has an output terminal 57. The pixel and charge transfer region have the same structures as those in the fourth embodiment except that a charge output portion 9 is not of the floating diffusion type, but is an input portion to the horizontal CCD 55 that is completely depleted when no charge exists and can transfer signal charges to a depletion layer formed by the gate electrode of the horizontal CCD 55. Vertical charge transfer operation of a pixel signal in the fifth embodiment is the same as in the fourth embodiment except that no noise is read out, transferred pixel signal charges are directly input to the horizontal CCD, and an image pickup signal is obtained from the output terminal 57 in accordance with horizontal transfer.

The fifth embodiment can provide a solid-stage image pickup element which can simultaneously realize a wide dynamic range and high sensitivity by designing a large photodiode area of a pixel, and also be applied to a movie camera of visible light using high-speed vertical charge transfer. The fifth embodiment can obtain a small-noise signal almost free from noise generated from the read-out circuit because signal charges are transferred by the horizontal CCD.

The sixth embodiment of the present invention relates to an application of the charge transfer element of the second embodiment to an amplifier type solid-state image pickup element. In the amplifier type solid-state image pickup element, signal charges accumulated in a light-receiving pixel are guided to the control electrode of a transistor formed in a pixel, and an amplified signal is output from a main electrode. Amplifier type transistors are for example, an SIT image sensor using an SIT (A. Yusa, J. Nishizawa et al., "SIT image sensor: Design consideration and characteristics", IEEE trans. Vol. ED-33, pp. 735–742, June 1986), a BASIS using a bipolar transistor (N. Tanaka et al., "A 310K pixel bipolar imager (BASIS)", IEEE Trans. Electron Devices, Vol. 35, pp. 646–652, May 1990), a CMD using a JFET whose control electrode is depleted (Nakamura et al., "Gate accumulation type MOS phototransistor image sensor", Journal of Television Society, 41, 11, pp. 1,075–1,082, November, 1987), and a CMOS sensor using a MOS transistor (S. K. Mendis, S. E. Kemeny and E. R. Fossum, "A 128×128 CMOS active image sensor for highly integrated imaging systems", in IEDM Tech. Dig., 1993, pp. 583–586).

Figure 10:
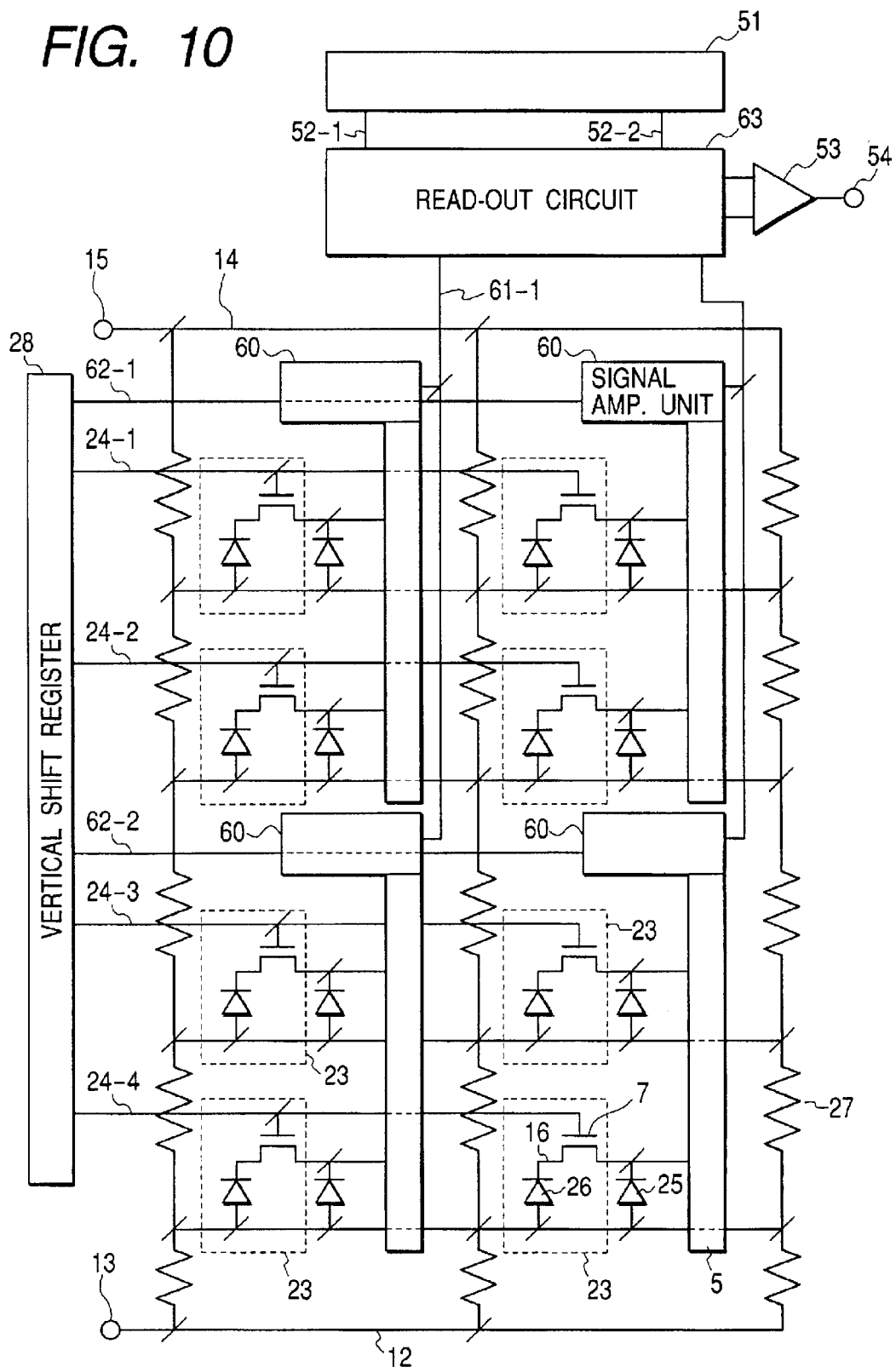
FIG. 10 is a circuit diagram for explaining the sixth embodiment of the present invention.
Figure 11:
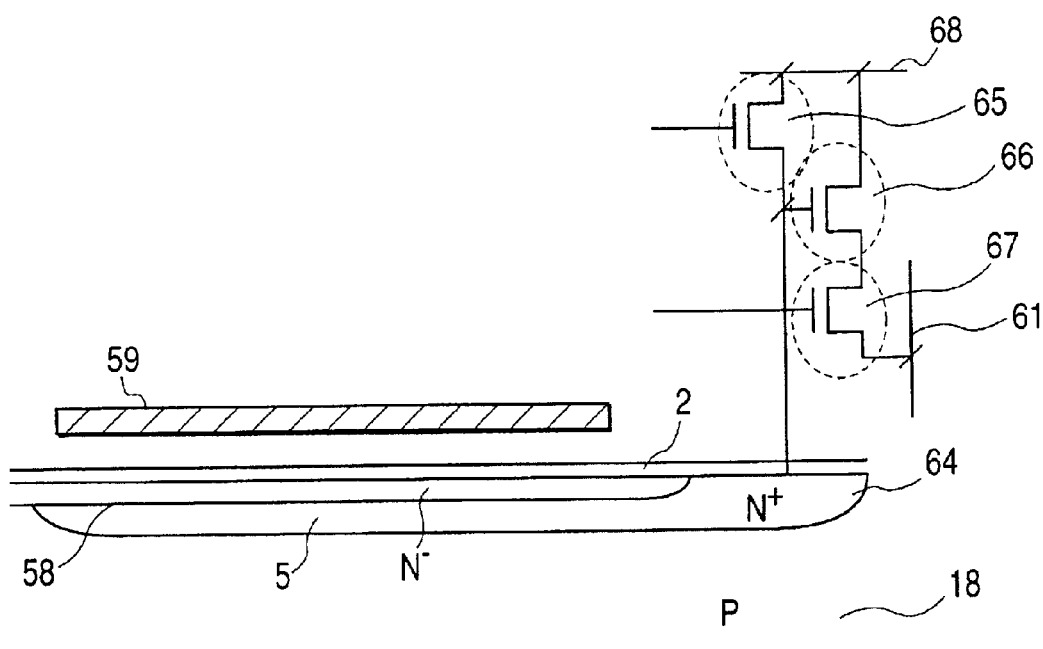
FIG. 11 is a circuit diagram for explaining the sixth embodiment of the present invention.

FIGS. 10 and 11 are views for explaining the sixth embodiment of the present invention. In FIGS. 10 and 11, the same reference numerals as in FIGS. 2A to 9 denote the same parts, and a description thereof will be omitted. In FIG. 10, the amplifier type solid-state image pickup element has signal amplifier units 60, and the control electrodes of the amplifier transistors receive transferred signal charges. Output lines 61 output signals amplified by the signal amplifier units 60, and output lines 61-1 and 61-2 are for the first and second columns. The signal amplifier 60 has driving lines 62, and output lines 62-1 and 62-2 are for the first and second rows. A read-out circuit 63 outputs to a final amplifier a signal output from the output line 61 in accordance with horizonal scan. Various types of read-out circuits can be used in accordance with the characteristics of a signal output from the amplifier unit 60. In FIG. 10, the read-out circuit shown in FIG. 5 is assumed, and the final amplifier is the differential amplifier 53. FIG. 11 is a sectional view showing connection between the transfer path 5 and the amplifier unit 60 when the amplifier unit 60 is of the CMOS sensor type. In FIG. 11, a MOS transistor 65 resets a floating diffusion portion (FD portion) 64, and an amplifier type transistor 66 has a gate connected to the FD portion 64. A switch MOS transistor 67 connects the output line 61 to the output portion of the amplifier type transistor 66, and selects an output row. A power supply line 68 serves as the power supply line of the amplifier type transistor 66 and the reset power supply line of the reset transistor 65. The gates of the reset transistor 65 and selection transistor 67 are connected to one of the driving lines 62, and receive pulses in accordance with scan by the vertical shift register 28.

The operation of the amplifier unit 60 will be briefly described. The amplifier unit 60 is selected by turning on the selection transistor 67. In this state, a pulse is applied to the gate of the reset MOS transistor to reset the FD portion 64. Since the output line 61 receives a constant current from the read-out circuit 63, the amplifier type transistor 66 operates as a source follower, and a potential corresponding to the gate potential of the FD portion 64, i.e., amplifier MOS transistor 66 appears on the output line 61. This potential is held at the reset level accumulation portion of the read-out circuit 63. Then, a signal transfer pulse is applied to a driving line 24 on a selected row, and signal charges are transferred to the selected FD portion 64. At this time, potentials applied to power supply terminals 13 and 15 give a p-type well 18 a potential gradient, and signal charges are quickly transferred. A potential obtained by adding the signal voltage to the reset level potential appears on the output line 61. This potential is held at the (reset+signal) level accumulation portion of the read-out circuit 63. Signals held by the read-out circuit 63 are sequentially sent to the differential amplifier 53, and signals containing no noise, i.e., variations in reset level are output from the output terminal.

One FD and one amplifier unit are shared by two pixels in FIG. 10 for explaining the sixth embodiment, but are generally shared by two or more pixels.

The sixth embodiment can provide a high-sensitivity solid-state image pickup element because a plurality of photodiode pixels are gathered to one common FD, the number of amplifier units is smaller than that of pixels, and the aperture of the photodiode can be increased without increasing the FD capacitance, compared to a conventional amplifier type solid-state image pickup element having one amplifier unit for one pixel.

The fourth to sixth embodiments described above adopt the structure of the second embodiment in which a pixel and charge transfer region are formed in a well. However, the pixel and charge transfer region may be formed in a semiconductor substrate, like the first embodiment, or the location where a potential gradient is supplied may be sequentially moved along the charge transfer path, like the third embodiment. Pixel signal charges may be transferred not only in one direction but in two, upper and lower directions, and the charge output portions 9 may be formed at the two ends of the charge transfer region 5.

As described above, the charge transfer elements according to the first to third embodiments can transfer signal charges at high speed with small noise. The solid-state image pickup elements according to the fourth to sixth embodiments can be driven at a speed coping with moving pictures of visible light, and can attain high sensitivity and wide dynamic range.

The seventh embodiment when the solid-state image pickup element described in any one of the fourth to sixth embodiments is applied to a digital still camera (image pickup apparatus) will be described in detail with reference to FIG. 12.

Figure 12:
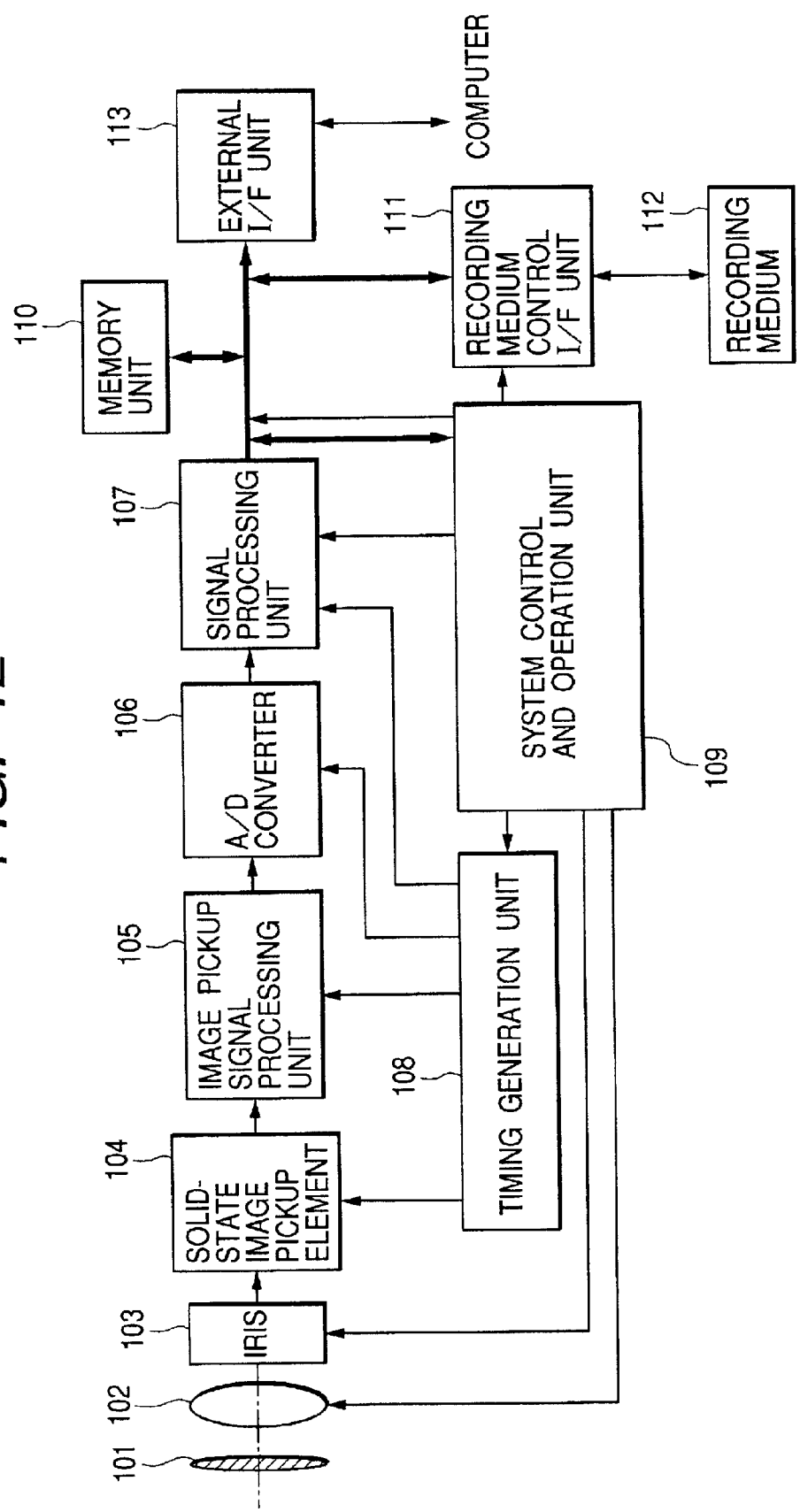
FIG. 12 is a block diagram for explaining an image pickup apparatus.

In FIG. 12, a barrier 101 serves as both a lens protector and main switch. A lens 102 forms an optical image of an object on a solid-state image pickup element 104. An iris 103 varies the light quantity having passed through the lens 102. The solid-state image pickup element 104 captures the object image formed on the lens 102 as an image signal. An A/D converter 106 analog-to-digital-converts the image signal output from the solid-state image pickup element 104. A signal processing unit 107 executes various correction processes for the image data output from the A/D converter 106, or compresses data. A timing generation unit 108 outputs various timing signals to the solid-state image pickup element 104, an image pickup signal processing unit 105, the A/D converter 106, and the signal processing unit 107. A system control and operation unit 109 controls various operations and the whole still camera. A memory unit 110 temporarily stores image data. An I/F unit 111 is used to record/read out data on/from a recording medium. Image data is recorded/read out on/from a detachable recording medium 112 such as a semiconductor memory. An I/F unit 113 is used to communicate with an external computer or the like.

The operation of the digital still camera in image pickup operation with the above arrangement will be explained.

When the barrier 101 is opened, the main power supply is turned on, the power supply of the control system is turned on, and the power supply of the image pickup system circuit including the A/D converter 106 is turned on.

To control the exposure amount, the system control and operation unit 109 sets the iris 103 to a full-aperture state. A signal output from the solid-state image pickup element 104 is converted by the A/D converter 106, and input to the signal processing unit 107. The system control and operation unit 109 calculates the exposure amount on the basis of the data.

The brightness is determined from the results of photometry, and the system control and operation unit 109 controls the iris in accordance with the results.

A high-frequency component is extracted from the signal output from the solid-state image pickup element 104, and the system control and operation unit 109 calculates the distance to the object. The lens is driven to check whether the image is in focus or not. If the image is out of focus, the lens is driven again to measure the distance.

After an in-focus state is confirmed, actual exposure starts.

After exposure, an image signal output from the solid-state image pickup element 104 is A/D-converted by the A/D converter 106, and written in the memory unit by the system control and operation unit 109 via the signal processing unit 107.

Data accumulated in the memory unit 110 are recorded on the detachable recording medium 112 such as a semiconductor memory via the recording medium control I/F unit under the control of the system control and operation unit 109.

Data may be directly input to a computer or the like via the external I/F unit 113 to process an image.

Many widely different embodiments of the present invention may be constructed without departing from the spirit and scope of the present invention. It should be understood that the present invention is not limited to the specific embodiments described in the specification, except as defined in the appended claims.

What is claimed is:

1. A charge transfer apparatus comprising:
    a semiconductor region of one conductivity type including a resistor region;
    a charge transfer region of a conductivity type opposite to the conductivity type of said semiconductor region that is formed in said semiconductor region and joined to said semiconductor region to form a diode;
    a signal charge input portion adapted to input a signal charge to said charge transfer region;
    a signal charge output portion adapted to accumulate the signal charge transferred from said charge transfer region; and
    a plurality of independent potential supply portions adapted to supply a potential gradient to said semiconductor region independently of said charge transfer region, said signal charge input portion and said signal charge output portion, said plurality of independent potential supply portions supplying said semiconductor region with respectively different potentials, said plurality of independent potential supply portions being connected to each other through said resistor region formed in said semiconductor region,
    wherein the signal charge in said charge transfer region is transferred by the potential gradient formed by said plurality of potential supply portions, and
    wherein the signal charge in said charge transfer region is transferred by drift over all of said charge transfer region.

2. An apparatus according to claim 1, wherein the charge transfer region is buried in said semiconductor region and forms a buried diode together with said semiconductor region.

3. A charge transfer apparatus comprising:
    a semiconductor region of one conductivity type including a resistor region,
    a charge transfer region of a conductivity type opposite to the conductivity type of said semiconductor region that is formed in said semiconductor region and joined to said semiconductor region to form a diode;
    a signal charge input portion adapted to input a signal charge to said charge transfer region;
    a signal charge output portion adapted to accumulate the signal charge transferred from said charge transfer region; and
    a plurality of independent potential supply portions adapted to supply a potential gradient to said semiconductor region independently from said charge transfer region, said signal charge input portion and said signal charge output portion, said plurality of independent potential supply portions supplying said semiconductor region with respectively different potentials, and said plurality of independent potential supply portions being connected to each other through said resistor region formed in said semiconductor region, wherein the charge transfer region is depleted before the signal charge is input,
    wherein the signal charge in said charge transfer region is transferred by the potential gradient formed by said plurality of potential supply portions, and
    wherein the signal charge in said charge transfer region is transferred by drift over all of said charge transfer region.

* * * * *

UNITED STATES PATENT AND TRADEMARK OFFICE
CERTIFICATE OF CORRECTION

PATENT NO. : 6,828,601 B2
DATED : December 7, 2004
INVENTOR(S) : Mahito Shinohara It is certified that error appears in the above-identified patent and that said Letters Patent is hereby corrected as shown below:

<u>Title page,</u>
Item [56], References Cited, FOREIGN PATENT DOCUMENTS,
"54150946" should read -- 54-150946 --.

<u>Column 10,</u>
Line 38, "solid-stage" should read -- solid-state --.

<u>Column 11,</u>
Line 8, "solid-stage" should read -- solid-state --.

Signed and Sealed this

Twenty-fifth Day of April, 2006

JON W. DUDAS
*Director of the United States Patent and Trademark Office*